(12) United States Patent
Bertin et al.

(10) Patent No.: US 6,268,748 B1
(45) Date of Patent: Jul. 31, 2001

(54) MODULE WITH LOW LEAKAGE DRIVER CIRCUITS AND METHOD OF OPERATION

(75) Inventors: Claude L. Bertin, South Burlington; John A. Fifield, Underhill; Russell J. Houghton, Essex Junction; Christopher P. Miller, Underhill; William R. Tonti, Essex Junction, all of VT (US)

(73) Assignee: International Business Machines Corp., Armonk, NY (US)

( * ) Notice: Subject to any disclaimer, the term of this patent is extended or adjusted under 35 U.S.C. 154(b) by 0 days.

(21) Appl. No.: 09/073,517

(22) Filed: May 6, 1998

(51) Int. Cl.[7] ............................................. G03K 19/094
(52) U.S. Cl. .................................. 327/108; 327/112
(58) Field of Search .................... 327/108, 112, 327/309, 310, 313, 318, 319, 322, 327, 328, 379, 384, 388, 389, 391; 365/185.23; 326/82, 83

(56) References Cited

U.S. PATENT DOCUMENTS

| | | | |
|---|---|---|---|
| 4,709,162 | 11/1987 | Braceras et al. | 326/81 |
| 5,257,238 | 10/1993 | Lee et al. | 365/230.06 |
| 5,450,025 | 9/1995 | Shay | 326/81 |
| 5,467,031 | 11/1995 | Nugyen et al. | 326/81 |
| 5,513,146 | 4/1996 | Atsumi et al. | 365/185.23 |
| 5,654,913 | 8/1997 | Fukushima et al. | 365/149 |
| 5,838,177 | * 11/1998 | Keeth | 327/108 |

* cited by examiner

Primary Examiner—Tuan T. Lam
(74) Attorney, Agent, or Firm—Thornton & Thornton; David R. Thornton; Robert A. Walsh

(57) ABSTRACT

An electronic semiconductor module, either memory or logic, having a driver circuit which includes a multiplicity of driver transistors, together with circuitry for simultaneously applying a first positive bias to a first select number of driver transistors to activate them to an operational state, a second positive bias to a second select number of driver transistors to place them in readiness for activation, and a negative bias to the remaining driver transistors to place them in a fully inactive state thereby reducing noise in the driver circuit. The first positive bias is greater than the transistor threshold voltage, preferably greater than two volts, the second positive bias is less than the threshold voltage, preferably less than one volt, and the negative bias is in the order of minus 0.3 volt. A method of reducing noise in the electronic semiconductor module is also described and includes the applying of a positive bias to a first select number of the transistors to activate them while simultaneously applying a second positive bias to a second select number of the transistors to ready them for activation, and a negative voltage to the remaining transistors to place each in a inactive condition.

22 Claims, 14 Drawing Sheets

US 6,268,748 B1

MODULE WITH LOW LEAKAGE DRIVER CIRCUITS AND METHOD OF OPERATION

FIELD OF THE INVENTION

This invention relates generally to computer memory or logic modules, and more particularly to memory or logic modules utilizing low leakage driver circuits and to a method of operating such modules in a low leakage mode.

BACKGROUND OF THE INVENTION

Multiple memory units such as Dynamic Random Access Memory units (DRAMs) and logic units, such as Application Specific Integrated Circuits (ASICs) and Microprocessors, utilized in computers for the storage and retrieval of data computations and etc., in conjunction with driver circuits, are generally provided in integrated circuit packages, or computer memory or logic modules. In these integrated circuit packages, leakage currents are a well known problem, and a major source of such leakage currents are the driver circuits. Conventionally, a large numbers of field effect transistors (FETs) are utilized as drivers, and while the leakage of any single driver transistor is generally rather small, the overall leakage of the circuit package is usually quite extensive due to the number of drivers employed.

In conventional driver circuits of the prior art, the system ground is applied to the gates of inactive transistors. The gate to source voltage (Vgs) of these transistors remains at or slightly above ground. The channel lengths of the FET transistors are chosen to be long enough to avoid unwanted leakage current. Generally, the accumulative leakage current requires construction of driver devices having minimum leakage, and the latter, in turn, places severe limitations on chip design, especially slower performance and greater chip area requirements.

An arrangement for reducing driver leakage in off chip driver circuits is described in U.S. Pat. No. 5,257,238, issued to Ruojia Lee et al on Oct. 26, 1993, wherein the leakage in the driver circuit is reduced by applying a negative bias, rather than simply ground voltage, to the inactive driver transistors. Now, while this arrangement results in a more complete turn off of the inactive transistors, and thus a reduction in leakage, it requires considerably more time to bring the negatively biased transistors up to an active state. Consequently, the speed of this prior art arrangement suffers accordingly.

SUMMARY OF THE INVENTION

Broadly, the invention comprises a memory or logic module and method having a driver circuit operating with reduced driver leakage. In accordance with the invention, the memory or logic module includes means responsive to a given operation of the module for simultaneously applying a first positive gate bias to a first number of driver transistors to place them in an operational state, a second positive gate bias to a second number of driver transistors to place them in a state of readiness for subsequent operation, and a negative gate bias to the remaining driver transistors to place them in a full off, or inactive condition and thereby reduce noise sensitivity and leakage current in the driver circuit. In this arrangement, the number of transistors to which the second positive bias is applied, are transistors which are anticipated to at least include the driver transistors which are anticipated as necessary for activation in the next subsequent operation of the module.

The means for applying the first and second positive biases and the negative bias to the select transistors groups, further includes means responsive to the next subsequent given operation of the module for applying the first positive bias to at least some of the second select number of transistors to activate them from their state of readiness to an operational state, and the second positive bias to another select number of said transistors, which have been determined as including those transistors likely to be next activated, and the negative bias to the new remainder of the transistors to place them in their full off condition.

Accordingly, it is an object of the present invention to provide a memory or logic module having reduced leakage.

Another object of the present invention is to provide a memory or logic module including a driver circuit operable in a low leakage mode.

Still another object of the present invention is to provide a memory or logic module of reduced leakage in conjunction with area efficient, driver transistor layouts.

A further object of the present invention is to provide a method of operating a computer memory or logic function in a reduced leakage mode.

These and other objects and features of the present invention will become further apparent from the following description taken in conjunction with the drawings.

BRIEF DESCRIPTION OF THE DRAWINGS

FIG. 6b schematically illustrates a variation of the improved driver unit of FIG. 6a;

DESCRIPTION OF THE PREFERRED EMBODIMENT

Figure 1:
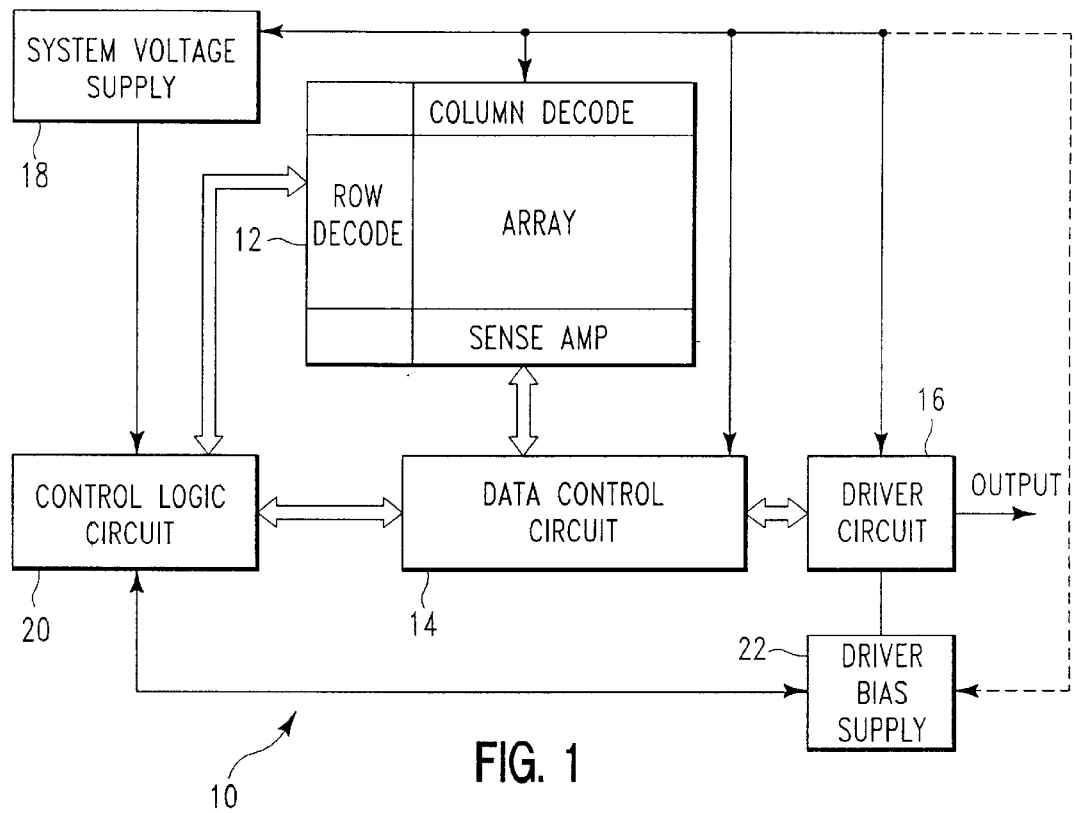
FIG. 1 is a block diagram of a computer memory module constructed for low leakage driver operations in accordance with one of the preferred embodiments of the invention.

FIG. 1 illustrates a memory module 10 provided in accordance with the invention that includes a memory circuit 12 and a data control circuit 14 exchanging bit information with a sense amplifier circuit portion of the memory circuit 12 and a driver circuit 16. The output of the data control circuit 14 is delivered to the driver circuit 16 for output in a conventional manner. The module 10 is powered from a system voltage supply 18, normally a positive voltage of three (+3.0) volts. Also included in the module 10 is an enabling circuit, or control logic circuit 20, which provides control of the memory module 10, the data control circuit 14 and the driver circuit 16. An external, negative power or driver bias supply 22, of approximately minus three (−3.0) volts, for example, is also converted to 0.3 volts and coupled to the driver circuit 16 and the control logic circuit 20.

The control logic circuit 20 is shown separate from the data control circuit 14 in order to simplify the explanation of the preferred embodiments. The logic circuit 20 is generally carried within, and is part of, the memory module, and performs logic control of the module 10 including the successive operational steps of the memory circuit, and the enabling and switching of various portions of the latter and its interfacing circuitry.

As will be subsequently explained with regard to FIGS. 2–4, the logic circuit 20 controls the memory module 10 in accordance with the invention to apply three different biases (Vgs) to three select groups of driver transistors for each operational step of the module to reduce driver leakage and to reduce noise susceptibility in the circuit. This overall low level of leakage current in the driver circuit 16 is accomplished by applying, in each operational step, a positive gate to source bias greater than the threshold voltage to those driver transistors requiring activation, a bias lower than threshold voltage and approximately equal to the source voltage to those driver transistors to be activated in the next operational step, and a negative bias to the remainder of the driver transistors to hold the latter in a full off condition.

As indicated, the logic circuit 20 controls the next operation of the module, and includes "look ahead" circuits which determine those aspects of the memory module which will probably be next rendered operational and the probability that a given group of driver transistors will also be rendered operational in that next operation.

Advantageously, aside from the generally small number of driver transistors rendered operational and those held in the ready state, the remainder of the driver transistors, normally the vast majority, are negatively biased to a fill off condition such that driver leakage is essentially due only to that small number of driver transistors held in the ready state.

The driver circuit 16 contains a multiplicity of driver units 26 which will be described in detail in conjunction with FIG. 2 below. For clarity, only a portion of the module 10 of FIG. 1 is illustrated in FIG. 2 with only one of the many driver transistor units 26 of the driver circuit 16 being shown. Thus, the driver transistor unit 26 is representative of each of the multiplicity of driver units carried in the driver circuit 16.

Figure 2:
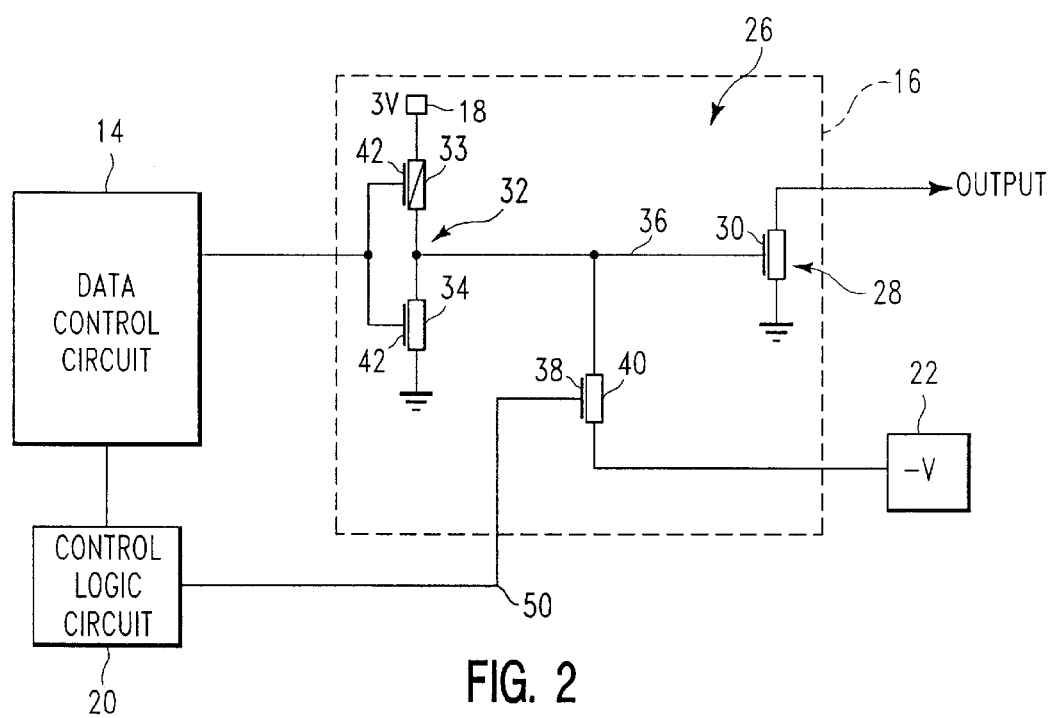
FIG. 2 schematically illustrates a driver unit of the driver circuit of FIG. 1, suitable for application of three different gate to source biases to its driver transistors.

As illustrated, in this FIG. 2, the driver unit 26 comprises a CMOS unit 32 comprising complementary FETs, such as a PMOS transistor 33 and an NMOS transistor 34. The CMOS unit 32 is energized by means of the system voltage supply 18 of typically three (+3.0) volts. In turn, the output of the CMOS unit 32 is coupled through a conductor 36 to the gate 30 of NMOS driver transistor 28 which is intended to produce one of the outputs of the driver circuit 16. The gates 42 of the CMOS unit 32 are commonly biased through the data control circuit 14 in a conventional manner, and thus, either three (+3.0) volts or ground (zero volts) is applied to the gates 42 of the transistors 33 and 34 in accordance with operation of the logic circuit 20 to turn the driver transistor 28 "on" or "off".

In practice, when the CMOS unit 32 is biased to a ground voltage, its PMOS transistor 33 is rendered conductive and thus, couples the gate 30 of the driver transistor 28 to the system supply 18. Thus, a positive bias will be applied to the transistor 28 which activates it to an operational state. On the other hand, when the CMOS unit 32 is biased to a positive voltage, its transistor 34 is rendered conductive and thus, couples the gate 30 of transistor 28 to ground. However, because noise and ground distribution losses, up to about +0.2 volts may actually be delivered to the gate 30 of the driver transistor 28 instead of ground (zero volts). A zero to slightly positive bias (approx. +0.2 volts) is applied to the select driver transistors, which is utilized to maintain the next to be activated driver transistors in a ready state An NMOS transistor 40, functioning as a switching transistor, is coupled between the gate 30 of the driver transistor 28 and the negative voltage supply 22 to allow negative biasing of the driver transistor 28. The gate 38 of the switching transistor 40 is connected to the logic circuit 20, via line 50, such that transistor 40 is also biased "on" or "off" by means of the system voltage supply 18 under the control of the logic circuit 20. Hence, when the transistor 40 is gated "on", it couples the negative supply 22 to the gate 30 of driver transistor 28 thereby rendering the latter "inactive".

Figure 3:
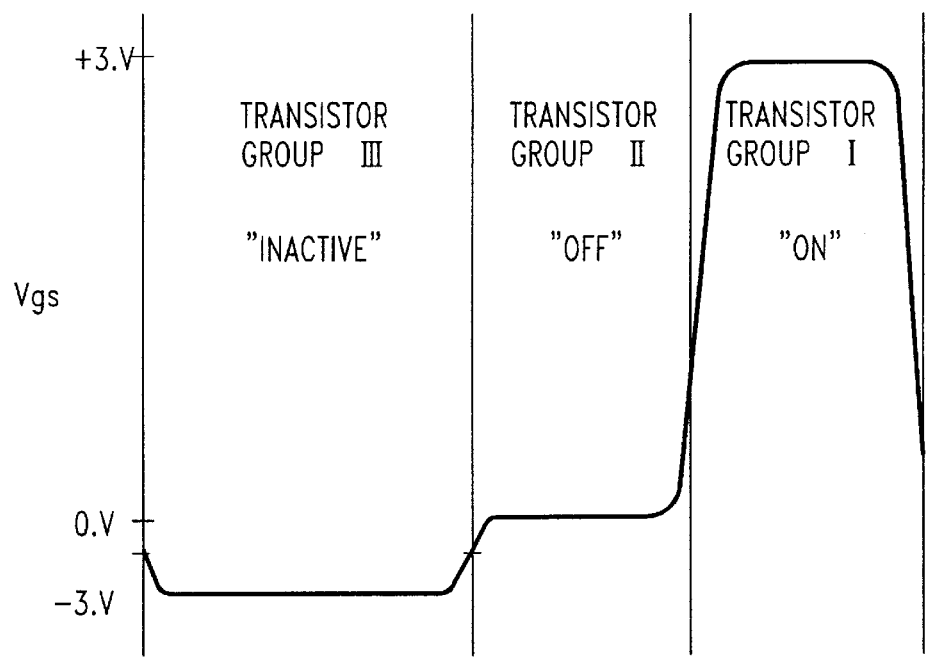
FIG. 3 is a graph depicting application of different biases to three select groups of driver transistors in the driver circuit of FIG. 1.

In FIG. 3, the voltage and current of three transistor driver groups, designated I, II and III, are illustrated. As will be later described with regard to FIG. 4, the group I driver transistors are biased at close to 3 volts to render them operational, and thus have a high current flow as illustrated. On the other hand, the group II driver transistors are biased to approximately zero volts and have a small amount of leakage current, and finally, the group III transistors are negatively biased to approximately minus three (−0.3) volts to a full off, or inactive, condition, where there is essentially no-leakage.

Figure 4:
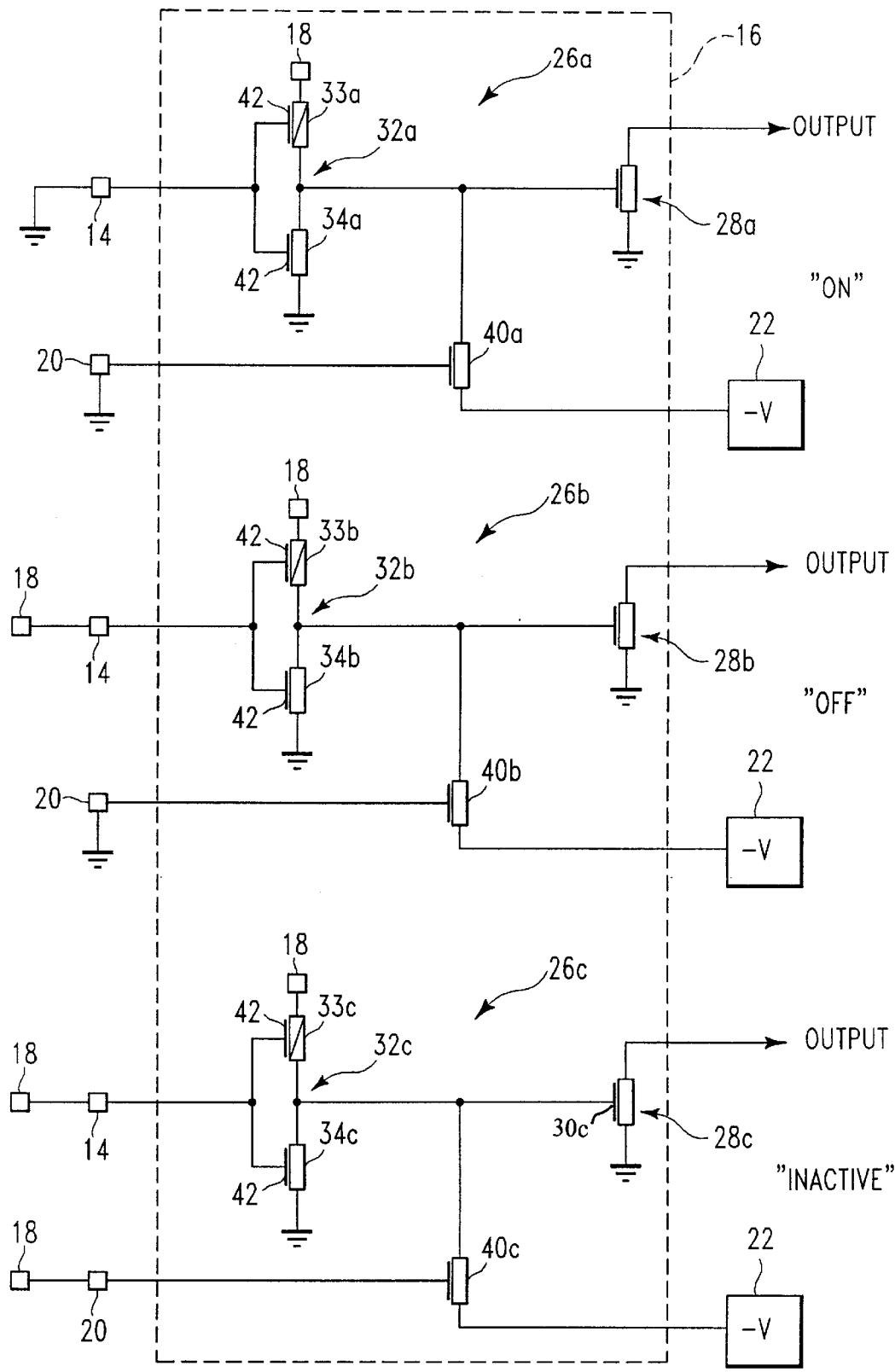
FIG. 4 is a graphical representation illustrating application of different biases to the three select groups of the driver transistors noted in FIG. 3.

These transistor driver groups I, II and III are represented in FIG. 4 by three transistor driver units 26a, 26b, and 26c, all identical to each other and to the transistor unit 26 of FIG. 2. The driver units 26a, 26b, and 26c represent the transistor groups I, II, and III, respectively. Thus, the driver unit 26a is simply one driver unit of the number of group I units, the driver unit 26b is one driver unit of the number of group II units, and the driver unit 26c is one driver unit of the number of group III units, Prior to describing the transistor groups in detail, it should be noted that in conventional prior art modules, similar logic circuits control only two driver groups in each operational step, and enables one driver group and disables the other. However, in the present invention, the logic circuit 20 enables one driver group, simply disables a second and fully inactivates a third for each operational step of the memory module. Hence, the logic circuit 20 in conjunction with the data control circuit 14, determines for each step, three different groups of driver transistors and applies three different biases to them in accordance with a first group requiring activation, a second group requiring readiness for next activation and a final group made up of the remaining driver transistors.

As shown in FIG. 4, a ground bias of zero volts is applied, via the data control circuit 14, to the gates of the CMOS unit 32a to render its driver transistor 28a to an "on" condition, and approximately ground or zero volts applied to the switching transistor 40a, via control logic circuit 20, to render it nonconductive. In this manner, the select transistors of group I are activated to render them operational for output of memory data.

Simultaneously, a positive voltage, from source 18, is applied to the CMOS unit 32b, via the data control circuit 14 to render its driver transistor 28b to an "off" condition, and ground or zero volts is applied, via logic control circuit 20, to the switching transistor 40b to render it nonconductive. In this manner, the transistors of group II are just turned "off", and while they contribute leakage, they are in a ready state for activation which retains circuit speed. In practice, the driver transistors 28b are biased to approximately zero volts. For example, less than the threshold voltage of transistor 28b.

Finally, a positive voltage from source 18 is applied, via the data control circuit 14, to the gates of the CMOS unit 32c in the driver unit 26c, and a positive bias (+3.0 volts) is simultaneously applied to the switching transistor 40c, via the logic control circuit 20. The latter renders the transistor 40c conductive and couples the gate 30c of driver transistor 28c to the negative supply 22. This negatively biases the driver transistor 28c to an "inactive" state with substantially no leakage. In similar fashion, all the driver transistors in group III are biased to the "inactive" state. Preferably, the negative supply 22 is approximately minus three (−3.0) volts, however, when it is applied to the gate 30c, it is reduced to approximately −0.3 volts due to the circuit in block 22. It should also be realized that the CMOS unit 32c could be allowed to float in some applications, for example, by using a tri-state circuit.

Thus, transistor 28a represents a first select number of driver transistors of driver unit 26a to which a first positive bias is applied to activate them to an operational condition, transistor 28b of driver unit 26b represents a second select number of driver transistors (the next to be activated) to which a zero bias is applied, and the transistor 28c represents the remainder of the driver transistors to which a negative bias is applied to hold them in an inactive state thereby reducing noise in the driver circuit.

Figure 12:
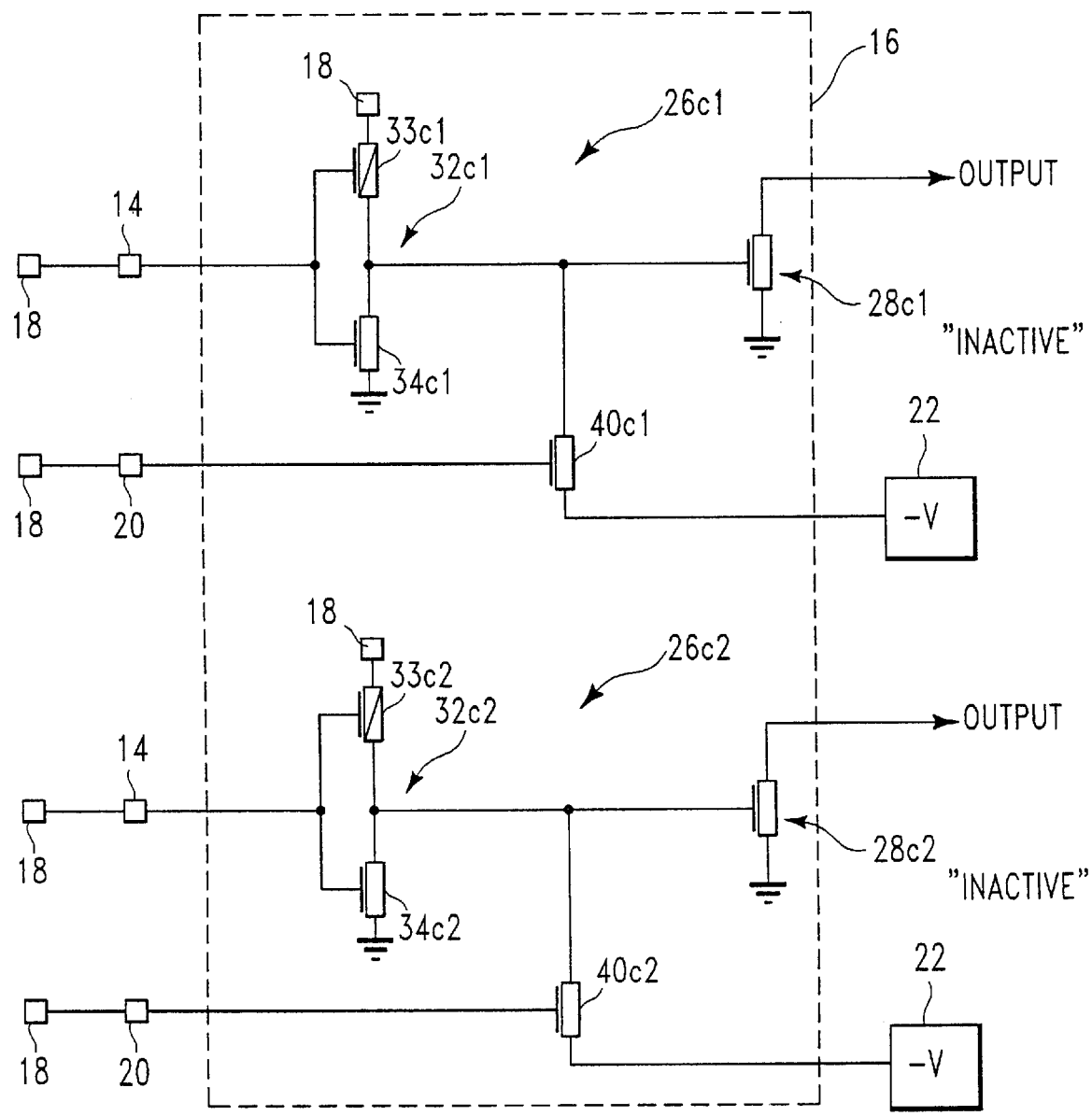
FIG. 12 schematically illustrates a plurality of inactive driver units identical to the unit depicted in FIG. 4.

While only a single, inactive driver unit 26c is illustrated in FIG. 4, a plurality of these units are shown in FIG. 12 as including two transistor driver units 26c1 and 26c2, both identical to each other and to the transistor unit 26c of FIG. 4. Similarly, the driver transistor 28c and switching transistor 40c of FIG. 4, are illustrated in FIG. 12 as 28c1 and 28c2 and their associated switching transistors as 40c1 and 40c2.

Figure 5:
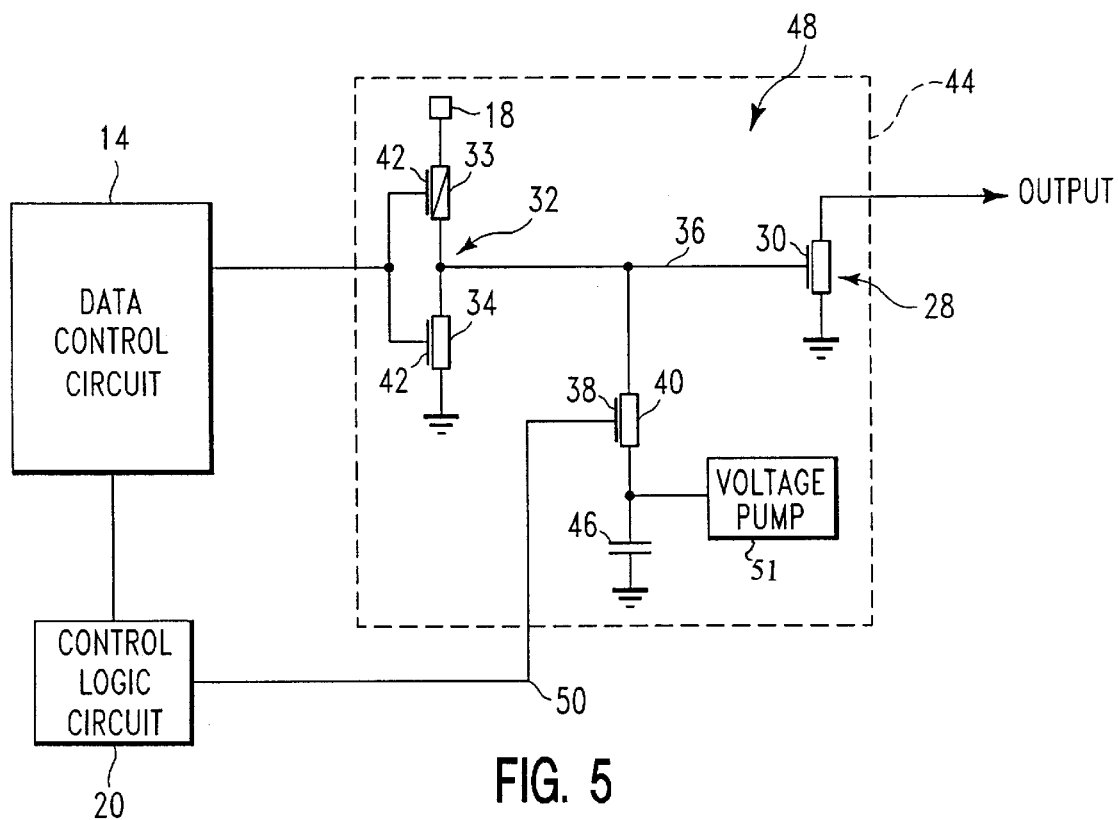
FIG. 5 is a circuit diagram of a preferred embodiment of the invention utilizing an on chip power supply to provide a negative gate to source bias for its driver circuit.

The negative bias applied to the select driver transistors of group III, can be provided by either switching the gate of each selected drive transistor to an externally supplied, negative voltage as described with regard to FIGS. 1–4, or to an internally generated voltage, stored on a large on chip capacitance 46, as shown in FIG. 5.

In FIG. 5, a driver chip 44, noted in dotted outline, carries a plurality of driver units, only one of which is shown as 48. In identical fashion to the driver units 26 of FIGS. 2–4, the driver unit 48 includes the drive transistor 28, the CMOS unit 32, and the switching transistor 40, but differs from the previously described embodiment in that it utilizes a large on chip storage capacitance 46 and a voltage pump 51. An example of a suitable voltage pump is described in U.S. Pat. No. 5,450,025, issued to Michael J. Shay on Sep. 12, 1995.

As illustrated, the capacitance 46 is connected between the switching transistor 40 and ground with the voltage pump 51 coupled between the switching transistor and the capacitance 46 so as to charge the latter to a suitable negative level. Then, when the switching transistor 40 is rendered conductive in accordance with the logic circuit 20, the stored charge of the capacitance 46 will be applied to the gate 30 of its driver transistor 28, which negatively biases the latter to a full off or "inactive" condition. A similar arrangement may be also be provided by substituting an on chip voltage regulator for the voltage pump 50.

Figure 13:
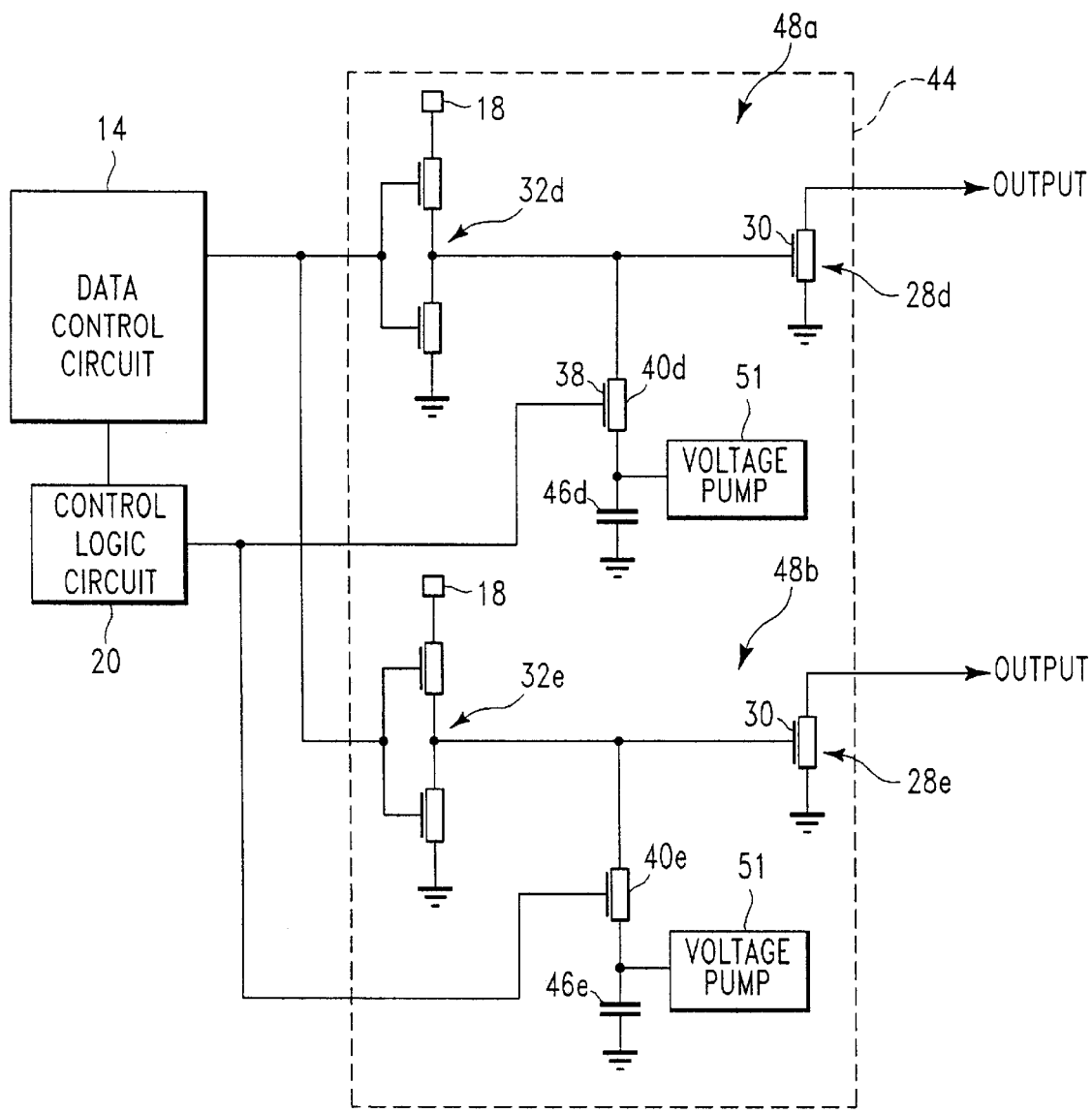
FIG. 13 is a circuit diagram illustrating a plurality of driver units identical to the unit depicted in FIG. 5 which utilize an on chip power supply to provide a negative bias in the driver circuit.

While only a single, representative driver unit 48 is illustrated in FIG. 5, a plurality of these units are shown in FIG. 13 wherein two transistor driver units 48a and 48b, both identical to each other and to transistor unit 48 of FIG. 5, are shown. Similarly, the driver transistor 28, switching transistor 40 and capacitance 46 of FIG. 5, are illustrated in FIG. 13 as driver transistors 28d and 28e, their associated switching transistors as 40d and 40e, and their respective capacitances as 46d and 46e.

It should be noted that the circuit shown in FIG. 2 in the "inactive" state has small leakage currents. The leakage current is from ground, through transistors 34 and 40, to the negative voltage source 22. These leakages occur because the source of transistor 40 is connected to voltage source 22 which, at about −0.3 volts, is more negative than the gate voltages applied to the gates of transistors 34 and 40. As will be explained below, it is possible and desirable to eliminate this source of leakage by modifying the driver unit circuit of FIG. 2 as shown in of FIG. 6a.

Figure 6A:
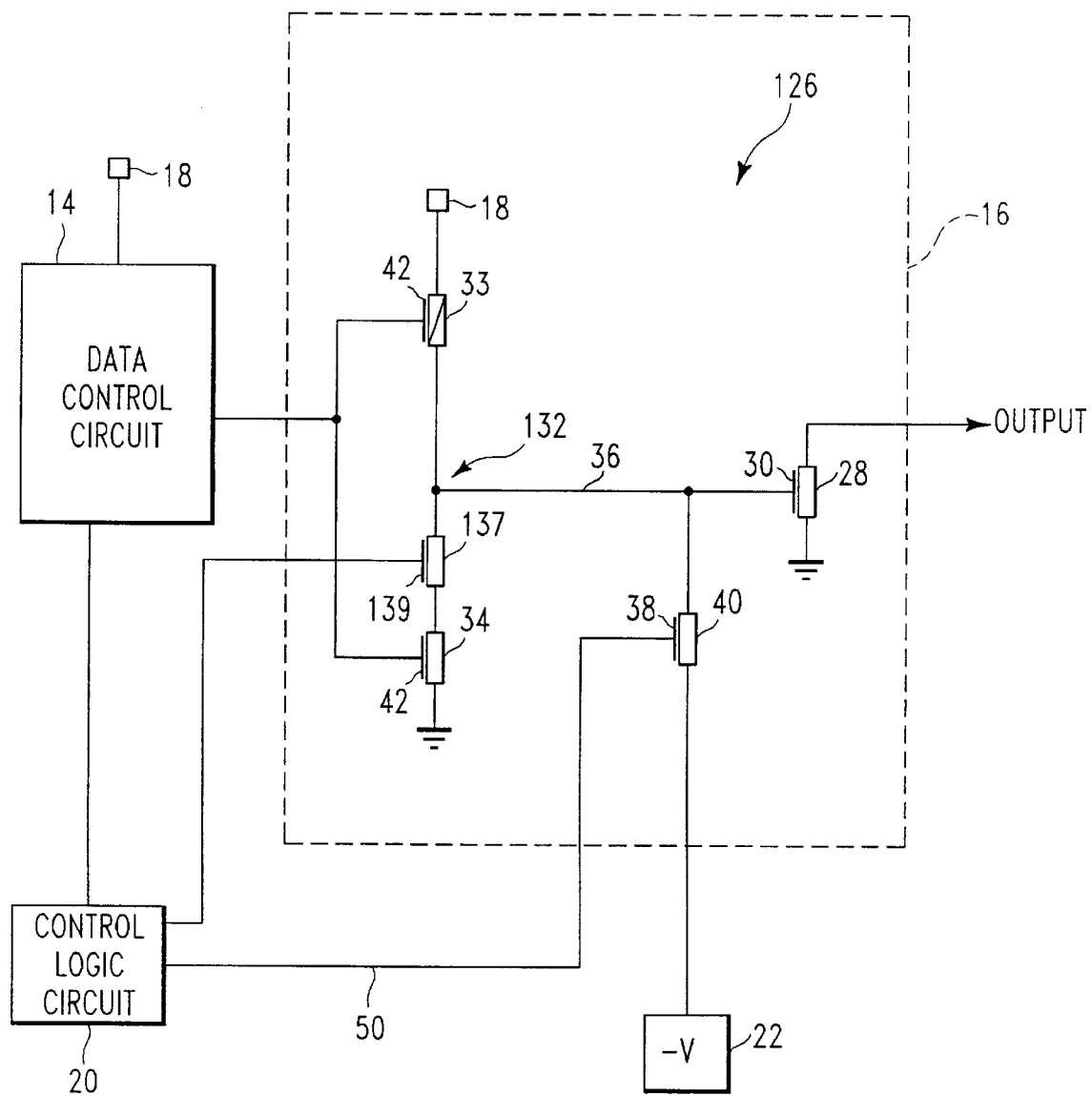
FIG. 6a schematically illustrates an improved driver unit of the driver circuit of FIG. 1, suitable for application of three different gate to source biases to its driver transistors.

The driver unit 126, of FIG. 6a differs from driver unit 26 of FIG. 2 by the addition of an NMOS transistor 137. With this alteration, it is possible to eliminate the above described leakages in the "inactive state and also reduces noise susceptibility in the circuit and lower overall leakage of the circuit. It should be noted that in this FIG. 6a, circuit elements identical to those shown in FIG. 2 are identified by the same numbers used in FIG. 2.

In this FIG. 6a, the CMOS unit 132 is comprised of NMOS and PMOS transistors 33 and 34 whose gates 42 are coupled to the data control circuit 14 and driven as discussed above in conjunction with the description of FIG. 2. More particularly however there is now provided an NMOS transistor 137 between the transistors 33 and 34. The added transistor 137 has its gate 139 coupled to and driven by logic circuit 20. As in FIG. 2, logic circuit 20, also controls transistor 40 via connection 50. The driver transistor unit 126 is again representative of each of the multiplicity of drive units carried in the driver circuit 16 as discussed above.

In the circuit of FIG. 6a, the CMOS unit 132 is energized by the system voltage supply 18 (+3.0 volts), via the data control circuit 14. In turn, the output of CMOS unit 132 is coupled through conductor 36 to the gate 30 of the gate driver transistor 28. The gates 42 of the transistors 33 and 34 are again commonly biased by the data control circuit 14, as described above in conjunction with FIG. 2, and again either +3.0 volts or ground (zero volts) is applied to the gates 42 in accordance with the operation of the logic circuit 20 to establish a portion of the connection required to turn transistor 28 on or off. In the present circuit however, the gate 139 of the transistor 137 in the CMOS unit 132 is biased, via control circuit 20, to either +3.0 volts from source 18 or to −0.5 volts generated from a reference voltage as part of the operation of logic circuit 20. This additional transistor 137 is the element used to minimize leakage current in the pre-driver CMOS unit 132 as will be described in more detail in FIG. 7. Again, in addition to the control of gate voltage 30 of transistor 28 by CMOS unit 132 to produce the "on" and "off" states, transistor 40 may be activated by logic circuit 20 to create the "inactive" state.

Figure 7:
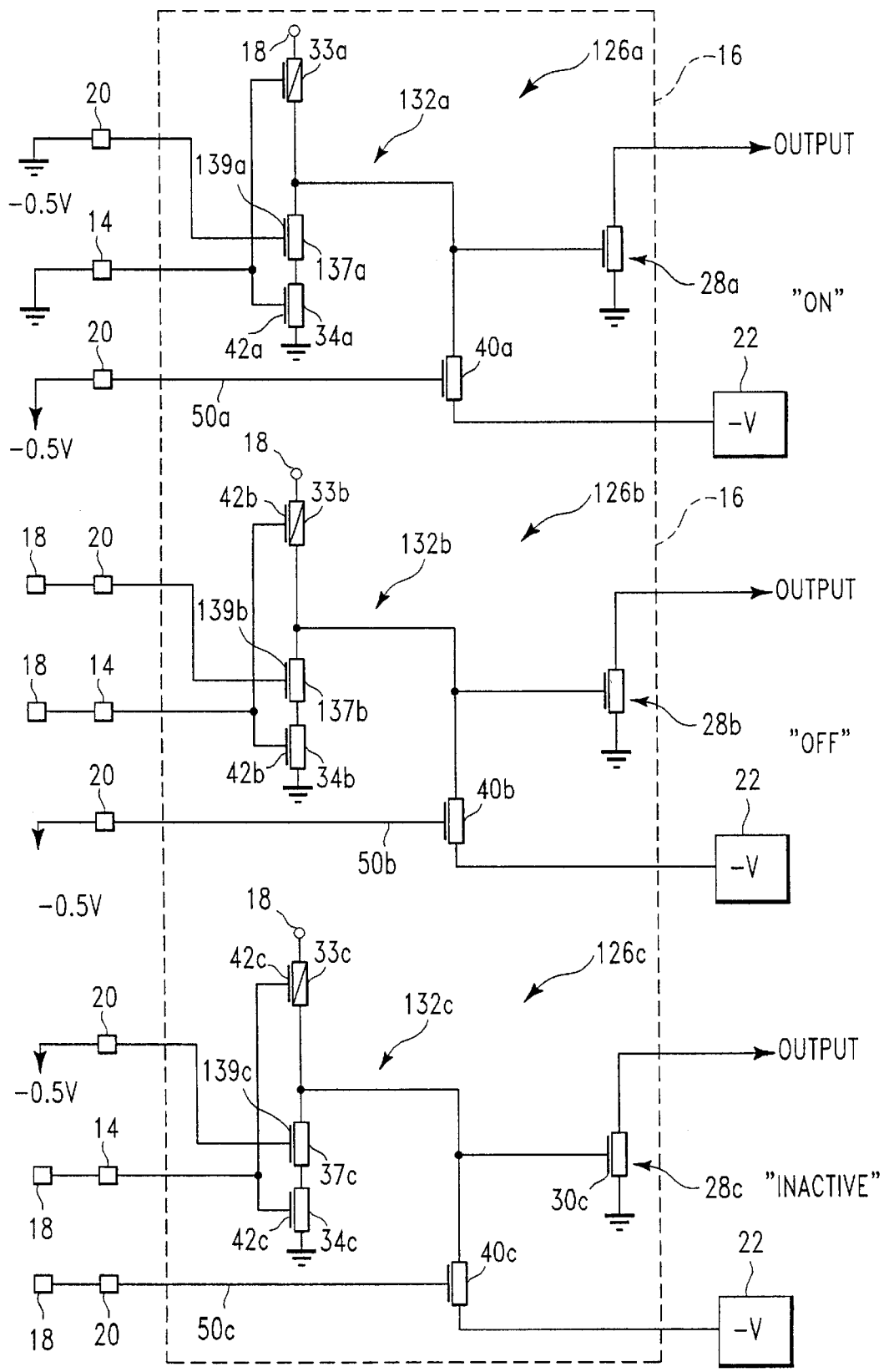
FIG. 7 is a graphical representation illustrating application of different biases to the three select groups of the driver transistors using the improved driver unit of FIG. 6.

Turning now to FIG. 7, the transistors in driver group I ("on"), group II ("off") and group III ("inactive") of FIG. 3 are represented in FIG. 7 by three transistors driver units 126a, 126b and 126c all identical to transistor driver unit 126 of FIG. 6a. The driver units 126a, 126b and 126c represent transistor groups I, II and III respectively. Thus, the driver unit 126a is simply one drive unit of a series of units in group I, the driver unit 126b is simply one drive unit of a series of units in group II, and the driver unit 126c is simply one drive unit of a series of units in group III.

Prior to describing the transistor groups in detail, it should be noted that in the prior art modules, only two driver groups were established in each operational step, i. e., one group was enabled and the other group disabled. In contradistinction, the present invention, via the logic circuit 20, arranges the driver circuit into three groups and enables one group, disables a second group and fully inactivates the third group. Furthermore, logic circuit 20, in conjunction with the additional CMOS driver transistor 137 and gate voltage swings from −0.5 to 3.0 volts minimizes leakage currents in the pre-driver CMOS circuits 126a, 126b, and 126c.

As shown in FIG. 7, a ground voltage is applied to gates 42a of pre-driver CMOS unit 132a and −0.5 volts is applied to gate 139a of pre-driver CMOS unit 132a to turn on, i. e. render conductive, driver transistor 28a. Simultaneously approximately −0.5 volts is applied to the gate of transistor 40a to turn it off, i. e. render it non-conductive. In this manner, the select transistors of group I are activated to render them operational for output memory data. In this arrangement leakage current through transistor 40a is minimized because the gate voltage of transistor 40 is more negative than the −0.3 volts applied to the gate of transistor 28a and source of transistor 40a.

Simultaneously a positive voltage (+3.0 volts) is applied to the gates 139b and 42b of the CMOS unit 132b and −0.5 volts is applied to the gate of switching transistor 40b to turn driver transistor 28b off. In this manner, all the transistors of group II are turned off and while they may contribute some leakage they remain in a ready state for future speedy activation. In practice, the gates of all these driver transistors 28b and hence the sources of all the transistor 40b are biased to approximately zero (ground) volts. Again transistor 40b is fully turned off by the application of −0.5 volts to its gate which is more negative than the −0.3 volts applied to its source.

Finally, a positive voltage is applied to the gates 42c of CMOS unit 132c, and −0.5 volts is applied to the gate 139c of CMOS unit 132c, and a positive voltage applied to the gate of switching transistor 40c to couple the gate 30c of driver transistor 28c to the negative supply 22. This negative supply biases the driver 28c to an inactive state with substantially no leakage. In similar fashion, all driver transistors in group III are biased to the inactive state. Even though −0.3 volts, from source 22, is applied through transistor 40c to the source of transistor 137c it remains off because its gate voltage (−0.5 volts) is more negative than it source voltage (−0.3 volts), thus minimizing total leakage current.

It should be noted that a voltage pump 51 and capacitance 46 may be substituted for voltage source 22 as described in FIG. 5.

Transistor 28 of FIG. 6a and transistors 28a, 28b, and 28c of FIG. 7, referred to as pull down transistors, may be connected to a potential other than ground, to achieve a low output voltage level above or below ground. Voltage levels in the other transistors in the driver units 126 of FIG. 6a and driver units 126a, 126b, and 126c of FIG. 7, may be adjusted to accommodate a different lower voltage and still provide the "on", "off" and "inactive" modes of operation.

Figure 6B:
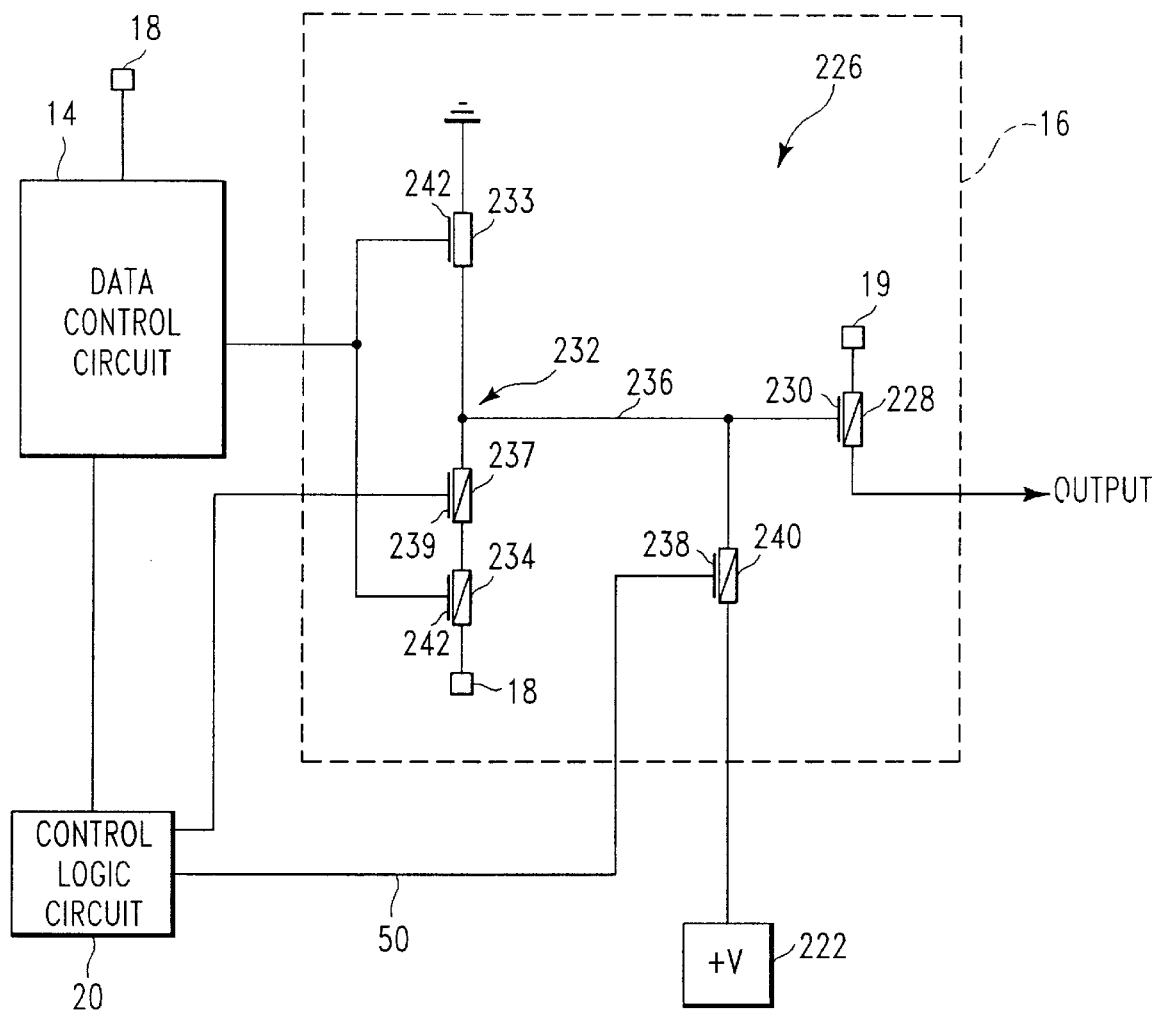

The well known principle of duality of NMOS and PMOS devices teaches that, in a circuit, NMOS and PMOS devices may be interchanged, together with the voltage polarities. FIG. 6b is thus performs the same function as the circuit shown in FIG. 6a, that is, it can place the driver transistor 228 in an "on", "off" or "inactive" state as taught in FIG. 6a but does so by using NMOS devices where PMOS devices were used in the circuit of FIG. 6a and vice versa. The applied voltages are similarly changed, i.e. where positive voltages were used in the unit of FIG. 6a negative voltages are used and vice versa.

More particularly in FIG. 6b there is shown a driver unit 226 in which the PMOS and NMOS devices have been interchanged for those shown in FIG. 6a. Thus, in FIG. 6b, PMOS transistors 228, 237 and 234 have been substituted for the NMOS transistors 28, 137 and 34 of FIG. 6a. In a like manner the voltage source 18 and ground have been interchanged so that transistor 233 is now coupled between ground and the line 236 and transistors 237 and 234 are coupled between the line 236 and voltage source 18. Moreover a positive voltage source 222 has, in FIG. 6b, been substituted for the negative voltage source 22 shown in FIG. 6a. In a similar fashion the pull up device 228 is now positioned between a voltage source 19 and the output instead of between the output and ground as shown in FIG. 6a. The voltage source 19 may be a different voltage than power supply 18 so that the high output voltage may be of a value different from that used on the chip.

The operation of the driver unit 226 shown in FIG. 6b need not be described in detail since its operation is similar that of the of previously described driver unit 126 and therefore obvious to one skilled in the art. Thus both the driver circuits 126 and 226 shown respectively in FIGS. 6a and 6b will provide "on", "off" and "inactive" states as described above.

Figure 14:
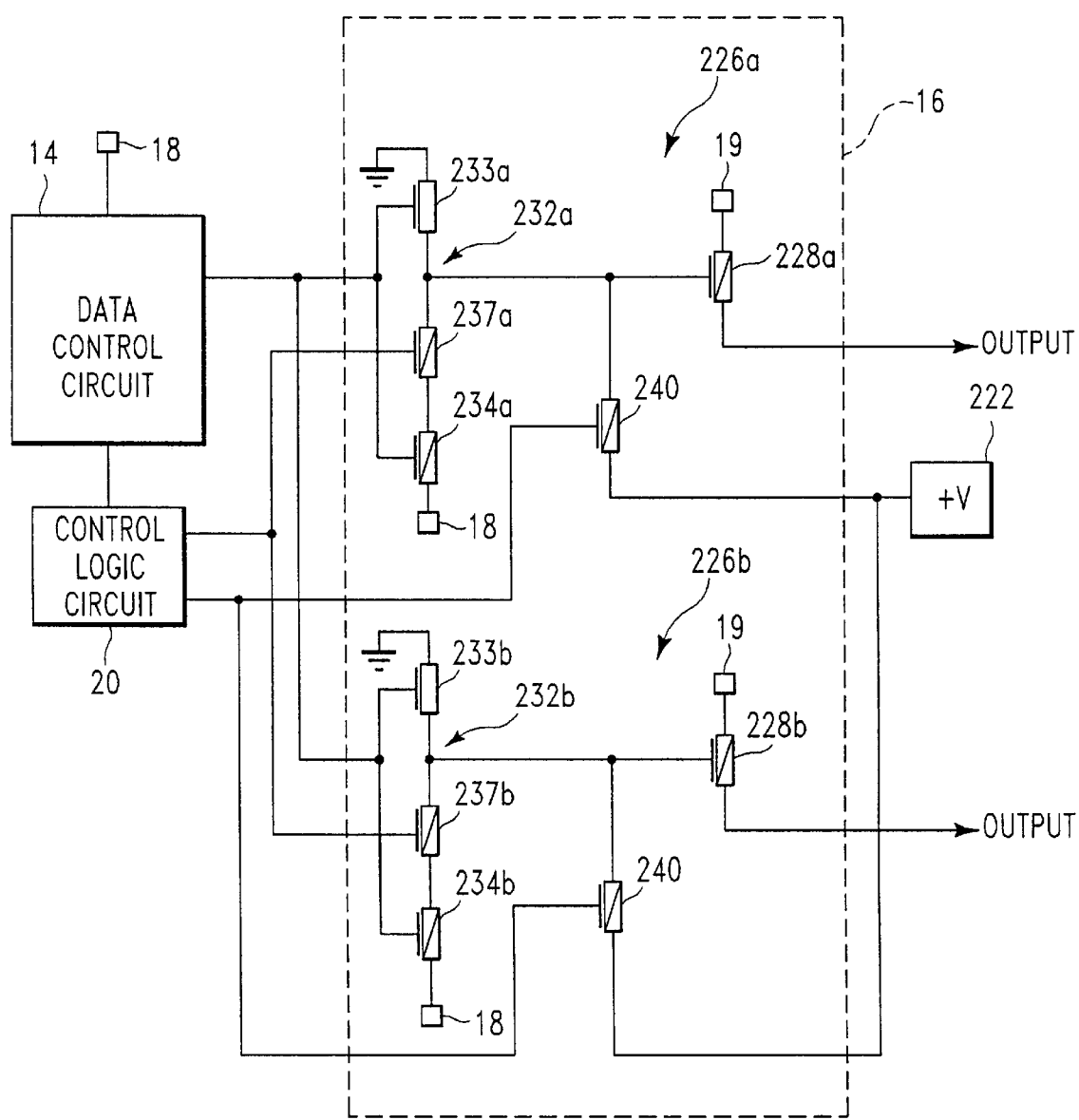
FIG. 14 is a circuit diagram illustrating a plurality of driver units identical to the unit illustrated in FIG. 6a which utilize PMOS driver transistors.

While only a single, representative driver unit 226 is illustrated in FIG. 6b, a plurality of these units are shown in FIG. 14 wherein two transistor driver units 226a and 226b, both identical to each other and to the transistor unit 226 of FIG. 6b, are shown. Similarly, the driver transistor 228 and switching transistor 240, are illustrated in FIG. 14 as 228a and 228b and their associated switching transistors as 240a and 240b.

Figure 6C:
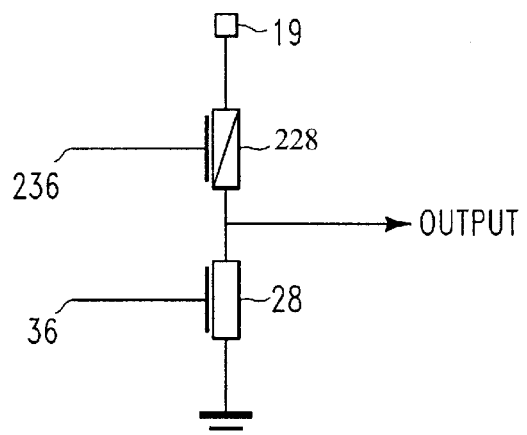
FIG. 6c schematically illustrates a combination of the improved driver units shown in FIGS. 6a and 6b.

FIG. 6c shows an arrangement where both the circuits of FIG. 6a and 6b are combined and so that the output is coupled in common to both transistor 28 and transistor 228. By so connecting the transistors 28 and 228 to the common output the circuit shown in this FIG. 6c is capable of supplying either pull up or pull down conditions to the output.

While it is more conventional to vary the gate potential to provide a suitable gate to source bias (Vgs), it can be advantageous in the inventive arrangement to maintain the gate at a fixed potential and raise the source of the driver transistor to provide a negative gate bias. Thus, as illustrated in FIGS. 8 and 9, negative biasing can be achieved by raising the potential of the driver transistor's source while retaining the gate of the select transistor at a lower voltage level, such as at ground potential.

Figure 8:
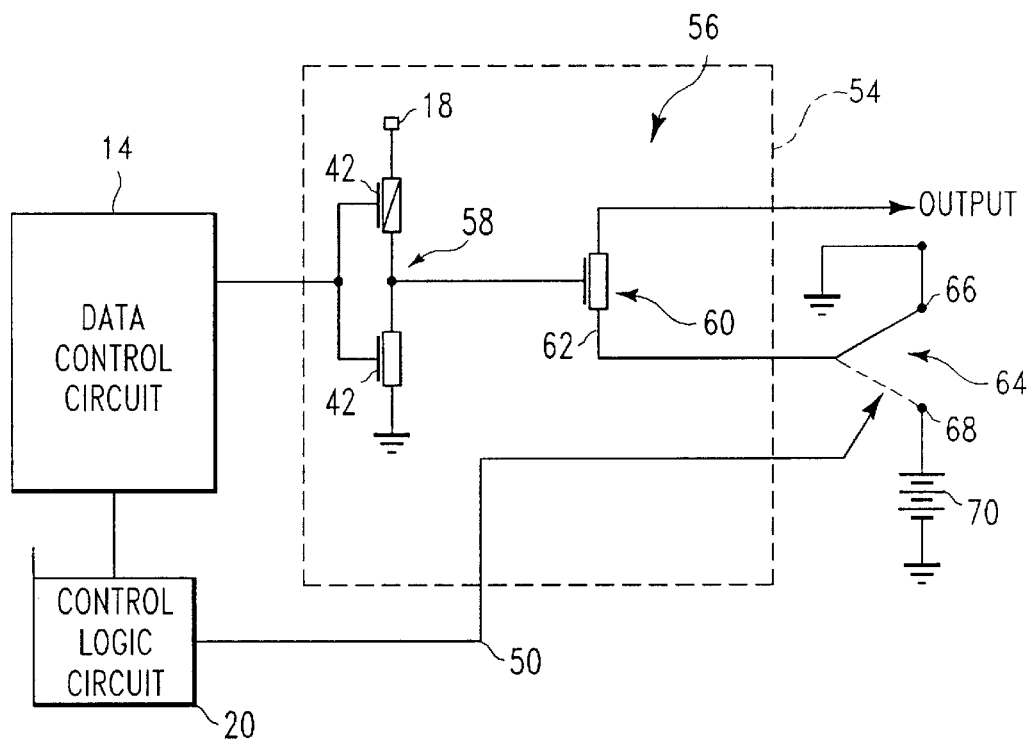
FIG. 8 is a circuit diagram of a preferred embodiment wherein a negative bias is applied to select driver transistors by varying their sources as their gates are held constant.
Figure 9:
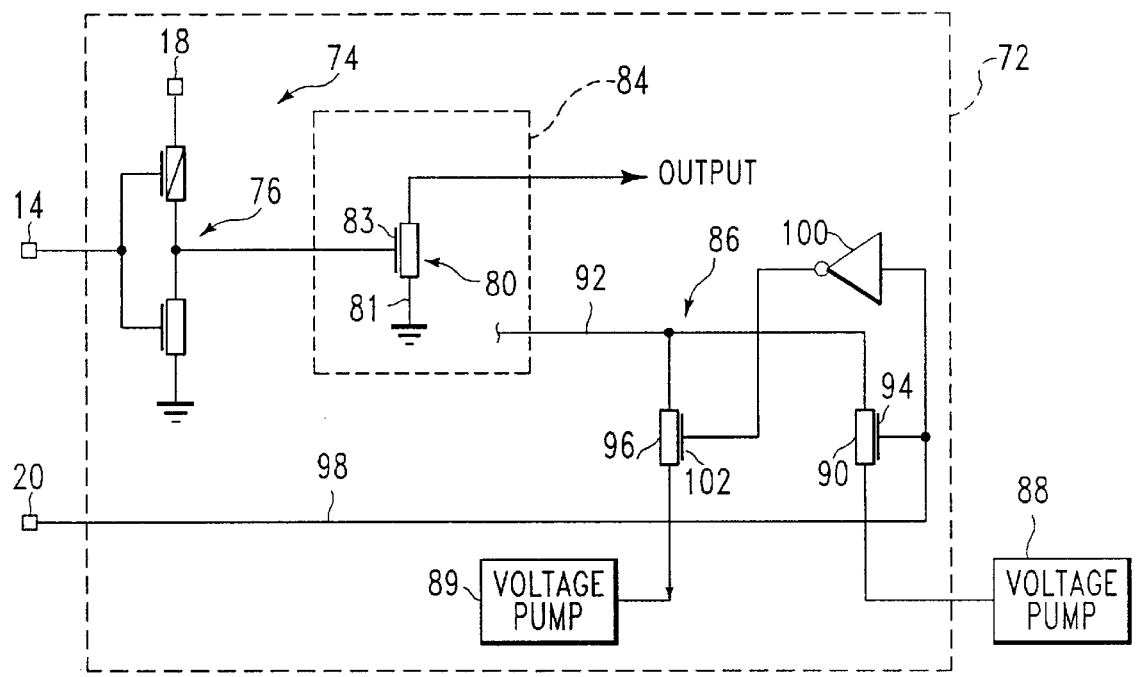
FIG. 9 is a circuit diagram of another embodiment of the memory module of the invention illustrating an arrangement for varying the driver substrate voltage to apply a negative bias to the driver transistors.

In FIG. 8, a driver circuit 54 is shown in dotted outline, and includes a driver unit 56, representative of the multiplicity of driver units in the circuit 54 and, the latter in turn, includes a CMOS unit 58, and a driver transistor 60. Unlike the previously described embodiments, the source 62 of the driver transistor 60 is coupled to a switch 64, which is operable between a ground position 66 and a positive voltage position 68 wherein it is in connection to a positive voltage source 70. For different select groups of the driver transistors 60 ("on", "off" and "inactive"), the switch 64 is actuated under the control of the logic circuit 20 to either its ground position or its positive voltage position.

Each CMOS unit 56 and each switch 64 is operable between two states by means of the logic circuit 20. When the switch 64 is enabled to ground, its associated driver transistor 60 can be rendered "on" or "off" in accordance with a positive or ground signal from its associated CMOS unit, respectively. On the other hand, when the switch 64 is enabled to its positive supply 70, the source 62 of its driver transistor 60 will exceed the gate voltage so as to negatively bias the driver transistor to an "inactive" condition in accordance with signals applied to its associated CMOS unit. Thus, in this embodiment, negative biasing (-Vgs) for those driver transistors selected for inactivation, is achieved by applying a positive potential to the driver transistor source.

Figure 15:
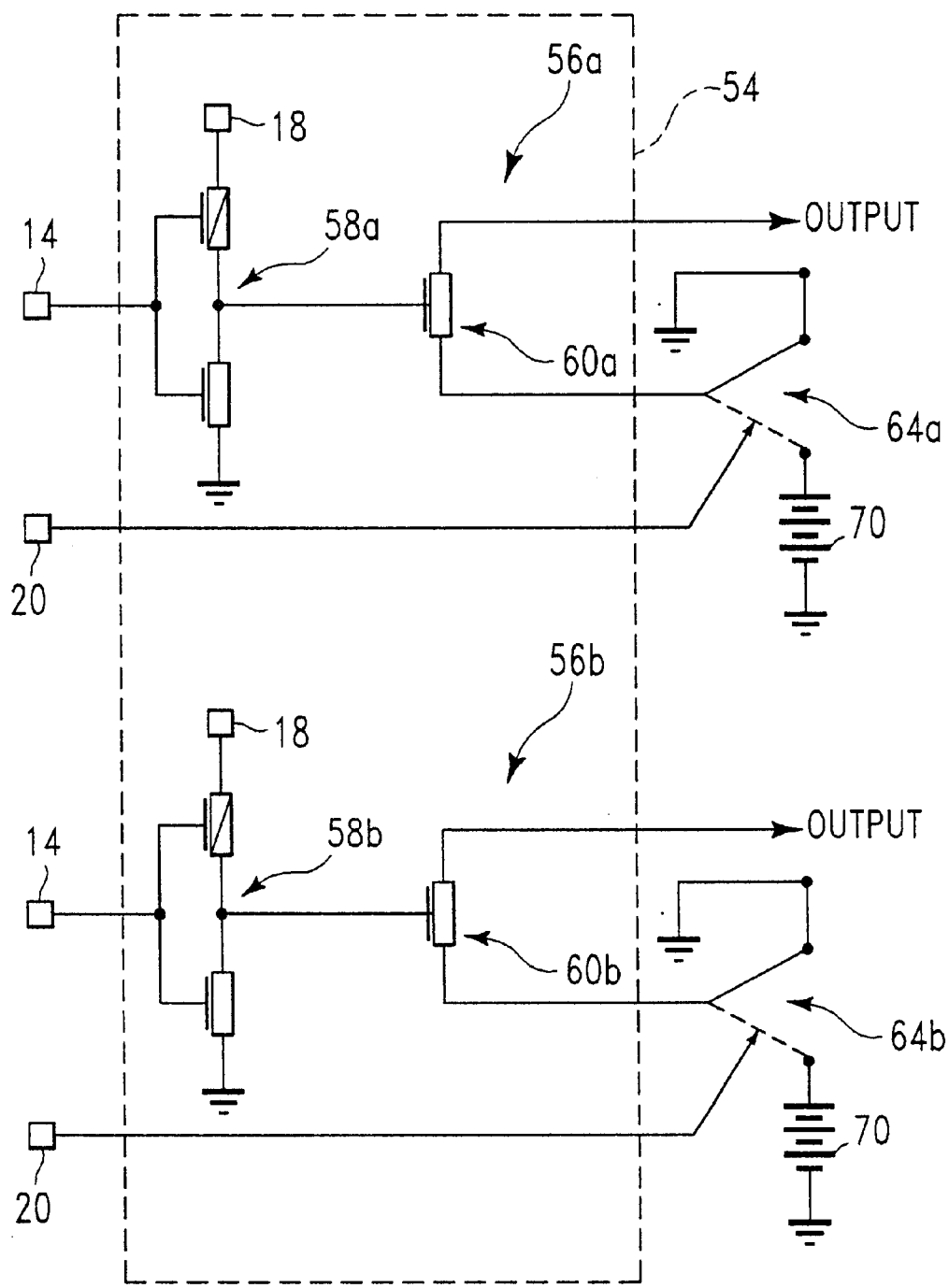
FIG. 15 is a circuit diagram illustrating a plurality of the circuit units identical to the unit depicted in FIG. 8 wherein a negative bias is applied to select driver transistors by varying their sources as their gates are held constant.

While only a single, representative driver unit 56 is illustrated in FIG. 8, a plurality of these units are shown in FIG. 15 wherein two driver units identical to driver unit 56 are illustrated as 56a and 56b. Similarly, the driver transistor 60 and its associated switch 64 of FIG. 5 are illustrated in FIG. 15 as driver transistors 60a and 60b and their associated switches as 64a and 64b.

In a further embodiment illustrated in FIG. 9, the back bias of the driver transistors is modulated to raise or lower the threshold voltage $V_{th}$ of driver 80. If the back bias of the local substrate (or well) voltage is made more negative relative to the source 81 of driver transistor 80, the threshold voltage $V_{th}$ of transistor 80 increases in value. The selected drivers go into an inactive state with very low leakage current, i. e., group III of FIG. 3. If the back bias voltage of the local substrate or well voltage is made more positive relative to the source 81 of driver transistor 80, then the threshold voltage of transistor 80 decreases in value. The selected drivers go into an "off" state, ready for rapid turn on but at a higher leakage current, i. e. group II of FIG. 3. As illustrated in FIG. 9, a driver chip 72 shown in dotted outline, includes a driver unit 74 representative of a multiplicity of driver units, having a CMOS unit 76 and a driver transistor 80, with the output of the CMOS unit connected to a gate 83 of the driver transistor 80. In this embodiment, the driver transistor 80 is formed within a local substrate or well 84, shown in dotted outline, which provides some isolation of the driver transistor from the substrate or other well of the chip 72.

To accomplish the substrate voltage modulation, a voltage supply unit 86 is connected to the local substrate 84 to modulate substrate voltage relative to the source 81 and thus modulate the threshold voltage $V_{th}$. As shown in FIG. 9 the voltage supply unit 86 is carried on the driver chip 72, and includes a voltage pump 88 which feeds its voltage through an NMOS transistor 90; the latter providing a first switching transistor of the supply unit 86. In turn, the switching transistor 90 is connected to the local substrate 84 via a conductor 92. A second switching transistor 96, also an NMOS transistor, is connected from conductor 92 to voltage pump 89 such that the local substrate 84 will be connected to the voltage pump 89 when the transistor 96 is rendered conductive. Voltage pump 88 and 89 may provide positive, ground or negative biases. Also a direct ground connection may be used instead of a voltage pump.

The gate 94 of the first switching transistor 90 is connected to the memory control logic circuit 20, not shown in this figure, via a conductor 98, and also to an inverter 100. In turn, the inverter 100 is connected to the gate 102 of the second switching transistor 96. Consequently, when an approximately zero voltage signal is delivered from the memory circuit to the gate 94 of the first switching transistor 90, the latter is rendered nonconductive, and the signal is also inverted by the inverter 100 and fed as a positive signal to the gate 102 of the second switching transistor 96 thereby rendering it conductive. This connects the conductor 92 and the local substrate 84 to the voltage pump 89. Voltage pump 89 connects substrate 84 to a voltage higher than the voltage applied to the source 81 thus lowering the threshold voltage $V_{th}$ of transistor 80, bringing it closer to its active state.

Now, when a positive signal is delivered to the gate 94 of the first switching transistor 90, the latter is rendered conductive and the local substrate 84 is, in turn, connected to the voltage pump 88. At the same time, the positive signal is inverted and fed to the gate 102 of the second switching transistor 96 to render it nonconductive. Hence, the substrate 84 voltage is made lower relative to source 81 of the driver transistor 80 thus raising the threshold voltage $V_{th}$ of transistor 80 such that the driver transistor 80 is biased to its "inactive" state. In a similar manner, an on chip voltage regulator, or an external voltage supply can be utilized to lower the local substrate voltage and increase the threshold voltage $V_{th}$ of the driver transistors to an inactive state.

Figure 16:
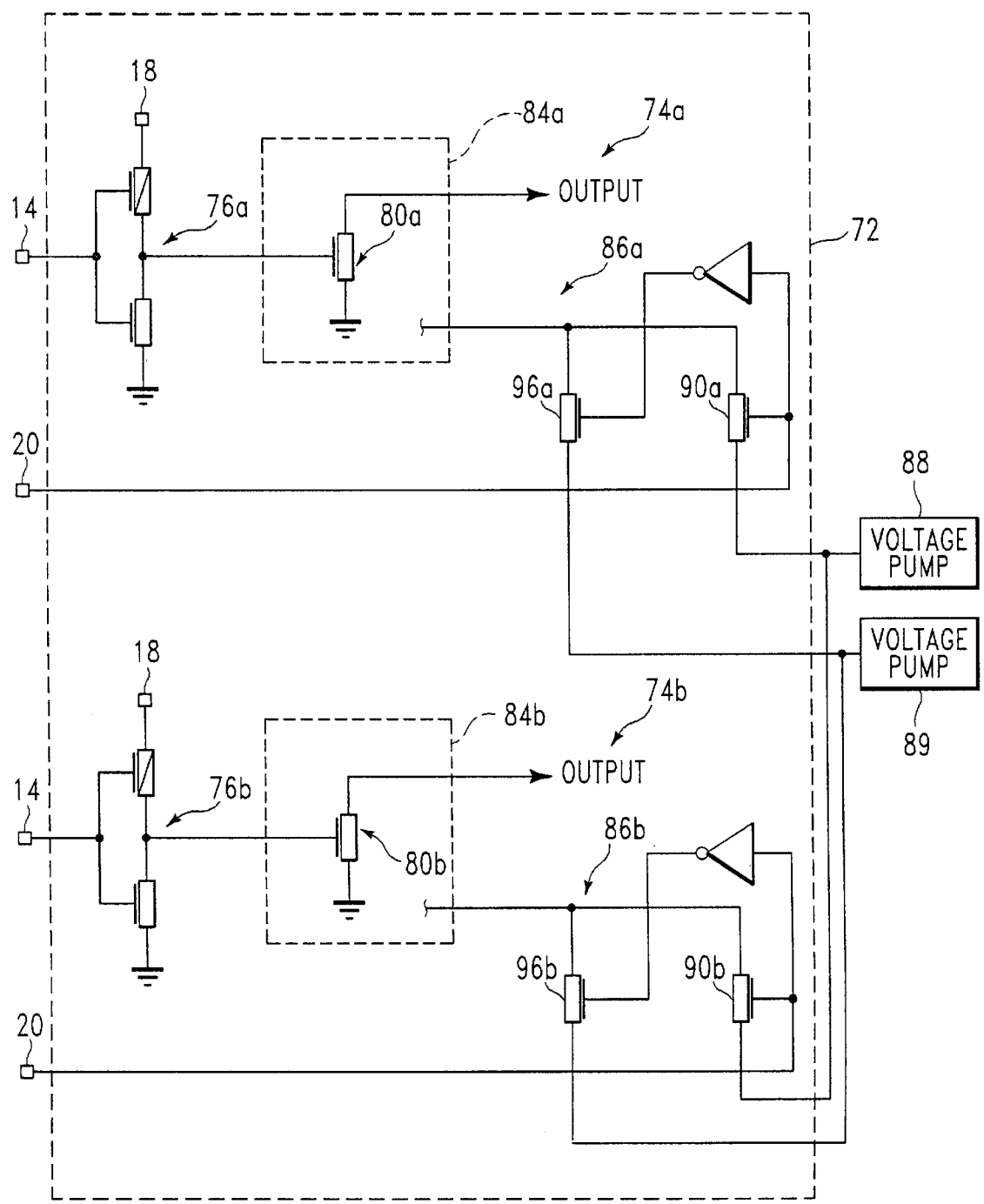
FIG. 16 is a circuit diagram illustrating a plurality of circuit units identical to the unit depicted in FIG. 9 wherein the substrate voltage of the driver transistors are varied to apply a negative bias to the driver transistors.

While only a single driver unit 74 and a single, representative driver transistor 80 are illustrated in FIG. 9, a plurality of these units and driver transistors are shown in FIG. 16. Therein a pair of driver units and driver transistors are shown as driver units 74a and 74b and driver transistors 80a and 80b, which are respectively identical to the driver unit 74 and driver transistor 80 of FIG. 9. Similarly, the local substrates are designated as 84a and 84b in FIG. 16, and in turn, the switching transistors 90 and 96 of FIG. 9 are designated as 90a and 96a in driver unit 74a and as 90b and 96b in driver unit 74b.

Figure 10:
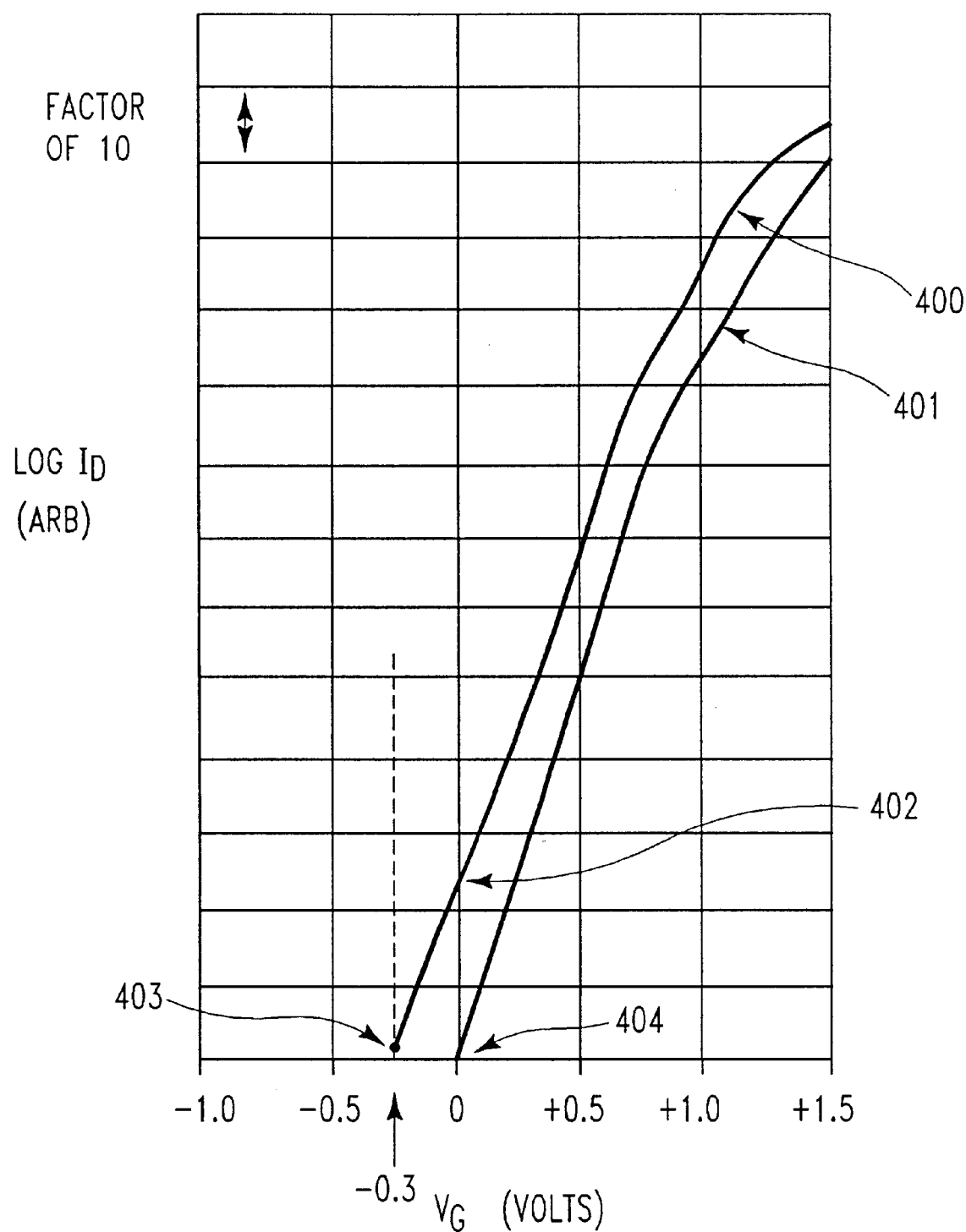
FIG. 10 is graph showing the device current of a driver transistor as a function of the gate to source voltage $V_{gs}$ for two substrate bias conditions.

FIG. 10 shows the device current of a driver transistor as a function of the gate to source voltage $V_{gs}$ for two substrate bias conditions. Curve 400 shows a typical $I_D$ device current vs. gate to source voltage $V_{gs}$ characteristic of a driver transistor as might be used as driver transistor 28 of FIG. 2, with the output drain voltage at 3.3 volts, and the source voltage and the substrate voltage both at ground (zero volts). The inactive region of FIG. 3, shown schematically in FIG. 4, transistor 28c, is at device operating point 403 of FIG. 10 when the gate voltage is equal to −0.3 volts. In this state device 28c has a low leakage current but is further from the onset of conduction to the "on" state.

The "off" region of transistor 28b, illustrated in FIG. 4 is at device operating point 402 of FIG. 10 with its gate voltage at ground or zero volts. In this state transistor 28b is closer to the onset of conduction, i. e. the "on" state, however the leakage current at this "off" state 402 is at least 100 times greater than the leakage at the "inactive" state point 403. For gate voltage greater than threshold voltage (typically in the 0.5 to 1.0 volt range), the driver transistor 28a, as shown in FIG. 4, is in the "on" condition.

Curve 401 shows a typical device current $I_D$ vs. gate to source voltage characteristic of the driver device 28 shown in FIG. 2, with the output drain voltage at +3.3 volts, the source voltage at ground (zero volts) and the substrate bias voltage at −0.3 volts. The "inactive" region, as discussed in FIG. 3, is at device operating point 404 of FIG. 10 when the gate voltage is at ground (zero volts) and the substrate of substrate 84 is at −0.3 volts.

For the driver transistor 80, as shown in FIG. 9, the output device has a low leakage current but is further from the onset of conduction, i. e. the "on" state. The "off" region of FIG. 3 is at device operating point 402 of FIG. 10 with gate voltage at ground (zero volts) and a substrate 84 voltage relative to source 81 of the output transistor 80 equal to zero.

Device 80 is closer to the onset of conduction, i. e. to the "on" state, however the leakage current at the "off" state 402 is at least 100 times greater than the leakage at the "inactive" state 404. For gate voltages greater than the threshold voltage (typically in the 0.5 to 1.0 volt range) the driver device is in the "on" condition.

Consequently, it should be understood that the invention reduces driver leakage to an suitable level in a driver circuit by applying a positive bias to a first select number of driver transistors to render them operational, while simultaneously applying an approximately zero bias to a second select number of driver transistors, which are next to be activated so as to maintain them in a ready state, and a negative bias to the remainder of the driver transistors to hold them in an inactive state with essentially no leakage.

Advantageously, the noted arrangement of holding the next to be operational transistors in a ready state while the remainder of the driver transistors are negatively biased to reduce their leakage, can not only be applied to conventional FET construction, but also to FET devices of reduced size to provide driver circuits having improved layout efficiency and fast response. The latter when combined with the inventive reduction of leakage, greatly enhances overall operation of the memory module.

Figure 11:
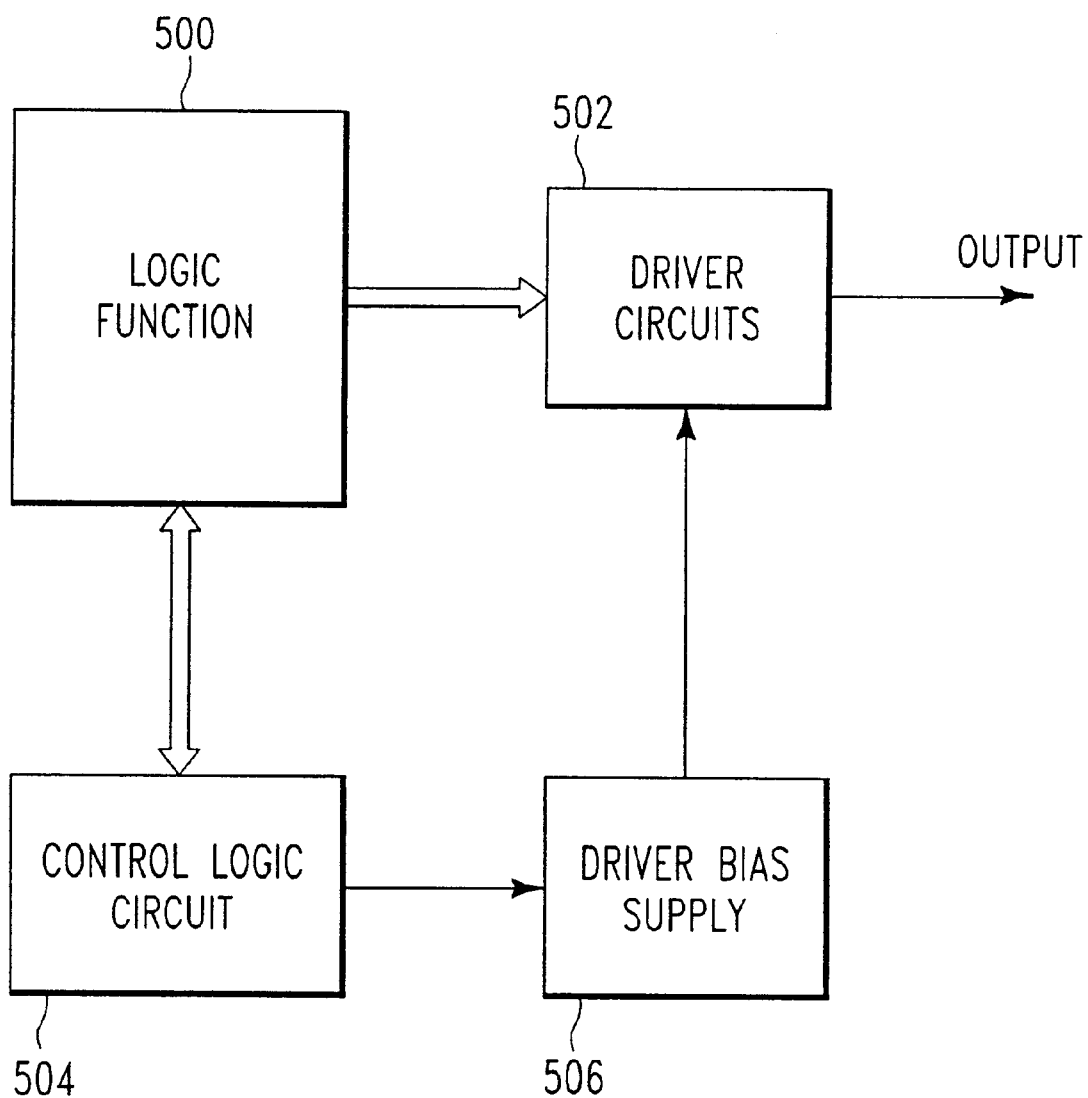
FIG. 11 shows a typical logic circuit having a logic function unit controlled by a control logic circuit which determines the state of the transistor in the driver circuits.

The advantages of the present invention has been described in terms of a memory function above but it should be understood that the invention can also be applied to logic circuits such as ASIC circuits, microprocessors, microcontrollers, digital signal processors, and the like. FIG. 11 shows a typical logic circuit having a logic function unit 500 controlled by a control logic circuit 504 which determines the state of the transistor in the driver circuits 502. These driver circuits are biased by the driver bias supply 506. The driver transistors, in the driver units 502, may be set into the "on", "off" or "inactive" state similar to that described previously.

Thus, the present invention results in an improved computer memory or logic module having reduced leakage, and a method of operation of driver circuits for providing reduced driver leakage. The present invention can be utilized with conventional chip layouts to further reduce their leakage levels, or may be utilized with layout efficient driver arrangements to reduce their leakage currents to acceptable levels.

This completes the description of the preferred embodiment of the invention. Since changes may be made in the above construction and method without departing from the scope of the invention described herein, it is intended that all the matter contained in the above description or shown in the accompanying drawings shall be interpreted in an illustrative and not in a limiting sense. Thus other alternatives and modifications will now become apparent to those skilled in the art without departing from the spirit and scope of the invention as set forth in the following claims.

What is claimed is:

1. An electronic module comprising:
   a semiconductor chip having a plurality of memories thereon;
   a driver circuit coupled to said semiconductor chip and comprising;
   a multiplicity of driver transistors, each driver transistor of said multiplicity of driver transistors having a substantially identical threshold voltage and each driver transistor of said multiplicity of said driver transistors being coupled to said plurality of memories and operable in conjunction with said semiconductor chip; and
   means responsive to a given operation in said electronic module for simultaneously applying a first positive bias, from a positive voltage source, to a first group of said driver transistors comprising a first select number of said driver transistors to place the driver transistors in said first group in an operational state, a second positive bias, from said positive voltage source, to a second group of said driver transistors comprising a second select number of said driver transistors to place the driver transistors in said second group in a state of readiness for activation, and a negative bias to a third group of said driver transistors, which third group comprises the remaining driver transistors, to place the driver transistors in said third group in a full off condition thereby reducing noise in said driver circuit.

2. The electronic module of claim 1 wherein said semiconductor chip is a memory chip.

3. The electronic module of claim 1 wherein said semiconductor chip is a logic chip.

4. The invention of claim 1 wherein said first positive bias is greater than the threshold voltage of said driver transistors, and said second positive bias is less than the threshold voltage of said driver transistors.

5. The invention of claim 1 wherein said first positive bias is provided by the application of a voltage greater than the threshold voltage of said driver transistors to the gates of the driver transistors in said first group, said second positive bias is provided by the application of a voltage less than the threshold voltage of said driver transistors to the gates of the driver transistors in said second group, and said negative bias is provided by application of a negative voltage of at least approximately minus 0.3 volts to the gates of the driver transistors in said third group.

6. The invention of claim 1 wherein said means responsive to a given operation in said module for applying said first and second positive biases and said negative bias to said transistors is a control logic means and includes a look ahead means responsive to the next subsequent given operation in said module for simultaneously applying;

said first positive bias to a selected few of the driver transistors in said second group to activate said selected few of the driver transistors in said second group to an operational state; and applying said second positive bias to a selected few of the driver transistors, in said third group, to place them in a state of readiness for activation.

7. The invention of claim 6 wherein said control logic means further includes a plurality of switching transistors each coupled between the gate of respective ones of said driver transistors of a respective and a negative voltage supply.

8. The invention of claim 1 wherein said driver transistors are provided in a driver chip, and said negative bias is provided from a negative voltage supply which is external to said driver chip.

9. The invention of claim 6 wherein said control logic means also includes a plurality of switching transistors each of said switching transistors being coupled to the gate of respective ones of said driver transistors of a respective group and coupled through a respective capacitance to ground, and a negative voltage source connected between each said switching transistor and its respective capacitance to charge the respective capacitance of each to a negative level, and means for turning on each switching transistor which is associated with respective ones of the driver transistors of said third group so as to discharge the respective capacitance connected to each of the turned on switching transistors and thereby apply a negative gate-to-source voltage to the driver transistors of said third group and so as to thereby provide said negative bias thereto.

10. The invention of claim 9 wherein said negative voltage source connected between each switching transistor and it's respective capacitance is a voltage source external to said control logic means.

11. The invention of claim 9 wherein said negative voltage source connected between each switching transistor and its respective capacitance is a voltage pump.

12. An electronic module comprising:

a semiconductor chip having a plurality of memories thereon;

a driver circuit coupled to said semiconductor chip and comprising;

a multiplicity of driver transistors, each driver transistor of said multiplicity of driver transistors having a substantially identical threshold voltage and each driver transistor of said multiplicity of driver transistors being coupled to respective ones of said plurality of memories and operable in conjunction with said semiconductor chip; and means responsive to a given operation in said electronic module for simultaneously applying a first positive bias, from a positive voltage source, to a first group of said driver transistors comprising a first select number of said driver transistors to place the driver transistors in said first group in an operational state, a second positive bias, from said positive voltage source, to a second group of said driver transistors comprising a second select number of said driver transistors to place the driver transistors in said second group in a state of readiness for activation, and a negative bias to a third group of said driver transistors comprising the remainder of said driver transistors to place driver transistors in said third group in a fill off state, said negative bias being applied to said third group by applying a given voltage to the gates of driver transistors in said third group and a positive voltage, which exceeds said given voltage, to the sources of driver transistors in said third group.

13. The invention of claim 12 wherein said driver transistors are provided in a driver chip, and said positive voltage applied to the sources of driver transistors in said third group is provided by an off chip voltage supply.

14. The invention of claim 12 wherein said driver transistors are provided in a driver chip, and said driver transistors are coupled to an off chip switching unit configured for connecting the sources of said driver transistors to either ground or said positive voltage in isolation from said driver chip.

15. The invention of claim 12 wherein said driver transistors are provided in a driver chip, and said driver transistors are coupled to an off chip voltage pump configured for providing said positive voltage to the sources of said driver transistors in said third group in isolation from said driver chip.

16. The invention of claim 13 wherein each driver transistor of said multiplicity of driver transistors is formed within a respective local substrate and wherein said applying of said positive voltage to the sources of driver transistors in said third group comprises applying said positive voltage to said local substrate of said driver transistors in said third group to raise the respective local substrate thereof to a level exceeding said given voltage to thereby negatively bias said driver transistors in said third group to a full off state.

17. An electronic module comprising:

a semiconductor chip having a plurality of memories thereon;

a driver circuit coupled to said semiconductor chip and comprising;

a multiplicity of driver transistors, each driver transistor of said multiplicity of driver transistors having a substantially identical threshold voltage and each driver transistor of said multiplicity of driver transistors being coupled to respective ones of said plurality of memories and operable in conjunction with said semiconductor chip;

means responsive to a given operation in said electronic module for simultaneously applying a first positive bias, from a positive voltage source, to a first group of said driver transistors comprising a first select number of said driver transistors to place the driver transistors in said first group in an operational state, a second positive bias, from said positive voltage source, to a second group of said driver transistors comprising a second select number of said driver transistors to place the driver transistors in said second group in a state of readiness for activation, a negative bias to a third group of said driver transistors comprising the remainder of said driver transistors to place driver transistors in said third group in a full off state, said negative bias being applied to said third group by applying a given voltage to the gates of driver transistors in said third group and a positive voltage, which exceeds said given voltage, to the sources of driver transistors in said third group said driver transistors are being provided in a driver chip, said positive voltage applied to the sources of the driver transistors in said third group is provided by an off chip voltage supply, each driver transistor of said multiplicity of driver transistors is formed within a respective local substrate, said applying of said positive voltage to the sources of driver transistors in said third group comprises applying said positive voltage to said local substrate of said driver transistors in said third group to raise the respective local substrate thereof to a level exceeding said given voltage to thereby negatively bias said driver transistors in said third group to a full off state, and each local substrate is connected to a circuit for connecting one or more selected substrate of said local substrates either to ground, wherein the driver transistor associated with each such grounded substrate is operable to an on or off state, or to said positive voltage which exceeds said given voltage, wherein the driver transistor associated with each such energized substrate is negatively biased to an inactive state.

18. A method of reducing noise in an electronic module comprising a semiconductor chip and a driver circuit having a plurality of driver transistors coupled thereto, and means for applying different select bias conditions to select ones of said driver transistors, the method comprising the steps of:

selecting a first group of driver transistors from said plurality of driver transistors;

applying a first positive bias to said driver transistors in said first group to activate said first group of driver transistors and place said first group of driver transistors in an operational state;

selecting a second group of driver transistors from said plurality of driver transistors;

applying a second positive bias to said second group of said driver transistors to place each of the driver transistors in said second group of driver transistors in a state of readiness for activation; and applying a negative bias to the remainder of said driver transistors in said plurality of driver transistors to place each driver transistor in said remainder of said driver transistors in a full off condition and thereby reduce current leakage therein.

19. The method of claim 18 wherein the step of applying said negative bias to said remainder of said driver transistors comprises applying a given voltage to the gates of said remainder of said driver transistors, and raising the voltage of the sources of said remainder of said driver transistors to a level exceeding said given voltage so as to negatively bias said remainder of said driver transistors to a full off condition.

20. The method of claim 18 further including the steps of:

applying said first positive bias to a first selected number of driver transistors in said second group of driver transistors to place said first selected number of driver transistors in said second group of driver transistors in an operational state; and applying said second positive bias to second select number of driver transistors in said third group of driver transistors to place said second selected number of driver transistors in said third group of driver transistors in a state of readiness for activation.

21. An electronic logic module comprising:

a semiconductor chip having 4 plurality of logic circuits thereon;

a driver circuit coupled to said semiconductor chip and comprising;

a multiplicity of driver transistors, each driver transistor in said multiplicity of driver transistors having a threshold voltage and said driver transistors being coupled to said plurality of logic circuits and operable in conjunction with said semiconductor chip; and means responsive to a given operation in said electronic logic module for simultaneously applying a first positive voltage, greater than the threshold voltage of said driver transistors, to the gates of a first group of said driver transistors to place them in an operational state, a second positive voltage, less than the threshold voltage of said driver transistors, to the gates of a second group of said driver transistors to place them in a state of readiness for activation, and biasing a third group of said driver transistors to place them in full off condition thereby reducing noise in said driver circuit.

22. An electronic memory module having a plurality of memories and a driver circuit having a multiplicity of driver transistors therein, each of said multiplicity of driver transistors having a substantially identical threshold voltage, each driver transistor of said multiplicity of said driver transistors being operable in conjunction with said module; and said module further includes:

means responsive to a given operation in said module for simultaneously applying a first bias to a first group of driver transistors in said multiplicity of driver transistors, said first group comprising a first select number of said driver transistors, said first bias placing the driver transistors in said first group in an operational state, and a second bias to a second group of driver transistors in said multiplicity of driver transistors, said second group comprising a second select number of said driver transistors, said second bias placing the driver transistors in said second group in a state of readiness for activation, and a third bias to a third group of driver transistors in said multiplicity of driver transistors, said third group comprising the remaining driver transistors in said multiplicity of driver transistors, and said third bias placing the driver transistors in said third group in a full off condition thereby reducing noise in said driver circuit.

* * * * *

UNITED STATES PATENT AND TRADEMARK OFFICE
CERTIFICATE OF CORRECTION

PATENT NO.    : 6,268,748 B1
DATED         : July 31, 2001
INVENTOR(S)   : Claude Bertin et al.

Page 1 of 1

It is certified that error appears in the above-identified patent and that said Letters Patent is hereby corrected as shown below:

<u>Title page,</u>
ABSTRACT,
Line 3, delete "together with circuitry." and add -- and means --.

<u>Column 14,</u>
Line 4, delete "fill" and add -- full --

Signed and Sealed this

Fourth Day of June, 2002

Attest:

Attesting Officer

JAMES E. ROGAN
*Director of the United States Patent and Trademark Office*